United States Patent

Fang et al.

[11] Patent Number: 5,858,844
[45] Date of Patent: Jan. 12, 1999

[54] METHOD FOR CONSTRUCTION AND FABRICATION OF SUBMICRON FIELD-EFFECT TRANSISTORS BY OPTIMIZATION OF POLY OXIDE PROCESS

[75] Inventors: Hao Fang, Cupertino; Farrokh Omid-Zehoor, Sunnyvale; Todd Lukanc, San Jose; Chris Schmidt, Sunnyvale, all of Calif.

[73] Assignee: Advanced Micro Devices, Inc., Sunnyvale, Calif.

[21] Appl. No.: 485,871

[22] Filed: Jun. 7, 1995

[51] Int. Cl.$^6$ .......................... H01L 21/336; H01L 21/31; H01L 21/469
[52] U.S. Cl. .......................... 438/303; 438/773; 438/774
[58] Field of Search .................. 437/29, 40 GS, 437/40 R, 41 R, 41 CS, 41 GS, 44, 40 SW, 41 SW, 979; 438/230, 265, 303, 770, 774, 773

[56] References Cited

U.S. PATENT DOCUMENTS

| | | | |
|---|---|---|---|
| 4,180,596 | 12/1979 | Crowder et al. | 427/42 |
| 4,216,573 | 8/1980 | Joshi et al. | 437/41 R |
| 4,382,827 | 5/1983 | Romano-Moran et al. | 437/44 |
| 4,503,598 | 3/1985 | Vora et al. | 29/571 |
| 4,616,399 | 10/1986 | Ooka | 437/41 SW |
| 4,786,609 | 11/1988 | Chen | 437/30 |
| 4,885,259 | 12/1989 | Osinski et al. | 437/43 |
| 5,208,175 | 5/1993 | Choi et al. | 437/43 |
| 5,217,913 | 6/1993 | Watanabe et al. | 437/44 |
| 5,371,026 | 12/1994 | Hayden et al. | 437/29 |
| 5,489,545 | 2/1996 | Taguchi | 437/53 |
| 5,498,556 | 3/1996 | Hong et al. | 437/44 |
| 5,573,965 | 11/1996 | Chen et al. | 437/41 SW |

*Primary Examiner*—Brian Dutton
*Attorney, Agent, or Firm*—Sawyer & Associates

[57] ABSTRACT

The present invention comprises an innovative gate oxidation process after the disposition of the gate and prior to the disposition of the source and the drain by exposing the gate to oxygen at a predetermined temperature and for a predetermined time period for the optimized transistor performance. During the innovative gate oxidation process, oxygen penetrates into the interfaces of the gate conductive layer gate oxide and the gate dielectric layer silicon substrate and oxidizes portions of the gate conductive layer at the interfaces due to the oxygen smiling or the bird beak effect, which results in an increased effective thickness of the gate dielectric layer. Optionally, HCl can be introduced at a predetermined flowrate during the innovative gate oxidation process. A particular embodiment of the present invention is the fabrication of MOS transistors with polysilicon as the gate conductive layer and silicon oxide as the gate dielectric layer, and with the source and drain fabricated by the low doped drain (LDD) implant. In this particular case, the innovative gate oxidation process is a polysilicon oxidation (POX) process grown before LDD implant. The oxidation temperature and oxidation time duration for optimized transistor performances have been found to be 850° C. and 115 minutes, respectively. This present invention is utilized to achieve maximum speed and performance by optimizing the POX process.

11 Claims, 5 Drawing Sheets

METHOD FOR CONSTRUCTION AND FABRICATION OF SUBMICRON FIELD-EFFECT TRANSISTORS BY OPTIMIZATION OF POLY OXIDE PROCESS

FIELD OF THE INVENTION

The present invention relates to transistor design, construction and fabrication. More specifically, the present invention relates to the design, construction and fabrication of metal-oxide-semiconductor field-effect transistors.

BACKGROUND OF THE INVENTION

MOS transistors are widely used in both analog and digital circuits, such as amplifiers, and analog-to-digital and digital-to-analog converters. Complementary metal-oxide-semiconductor (CMOS) field-effect transistors formed by pairs of N and PMOS transistors, are particularly widely used in large scale digital circuits, such as microprocessors, memory devices and gate arrays, as they have high performance and consume very little electric power.

A typical field-effect transistor comprises a substrate, at least one source disposed on the substrate, at least one drain disposed on the substrate, and at least one gate disposed on the substrate between the source and the drain. The gate typically comprises a conducting layer, such as a metal or a semiconductor layer, or the combination thereof, which is insulated from the source, the drain and the substrate by a dielectric layer, such as an oxide or a nitride layer.

The increasingly strong demand for higher speed, larger scale integrated circuits with higher component density and higher drive current has necessitated smaller and smaller component sizes. Presently the length of the channel of a MOS transistor has reached the submicron regime.

Unfortunately, the conventional submicron MOS transistors suffer from the problem of the short channel induced saturation threshold voltage (Vts) roll-off or the reduction of the absolute value of Vts as the channel length decreases, which results in a poorer controllability of the transistor.

The prior approaches to this problem include 1) to scale the gate oxide thickness, 2) to increase the channel ion implant dose, and 3) to employ a recently developed large angle package implant technique.

The first two approaches suffer from additional degradation in device reliability and performance, such as lower drive current resulted from reduced carrier mobility and lower speed resulted from increased junction capacitance; whereas the third approach, being a rather complicated process, is difficult implement for volume production.

The same situation is true for metal-insulator-semiconductor (MIS) field-effect transistors in general, as well as silicon-on-insulator (SOI) transistors.

Hence, there has been a need in the art for a simpler and more effective method suitable for volume production to provide both saturation threshold voltage (Vts) roll-off control and speed improvement without introducing additional degradation in device reliability and performance, such as lower drive current and lower device lifeline.

SUMMARY OF THE INVENTION

The need in the art is addressed by the present invention which provides an improved design, construction and fabrication of submicron field-effect transistors with enhanced saturation threshold voltage (Vts), speed, and drive current. The present invention comprises an innovative gate oxidation process after the disposition of the gate and prior to the disposition of the source and the drain by exposing the gate to oxygen at a predetermined temperature and for a predetermined time period for the optimized transistor performance. During the innovative gate oxidation process, oxygen penetrates into the exposed gate edges and further oxidizes portions of the gate conductive layer and substrate at the silicon edge which results in oxygen smiling. As one option, HCl can be used at a predetermined flowrate during the innovative gate oxidation process to change the shape of smiling without affecting other device parameters. A particular embodiment of the present invention is the fabrication of MOS transistors with polysilicon as the gate conductive layer and silicon oxide as the gate dielectric layer, and with the source and drain fabricated by the low doped drain (LDD) implant. In this particular case, the innovative gate oxidation process is a polysilicon oxidation (POX) process.

DESCRIPTION OF THE INVENTION

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

The present invention comprises an innovative gate oxidation process after the disposition of the gate and prior to the disposition of the source and the drain by exposing the gate to oxygen at a predetermined temperature and for a predetermined time period for the optimized transistor performance. During the innovative gate oxidation process, oxygen penetrates from the edge of the gate conductive layer and the gate dielectric layer and oxidizes portions of the gate conductive layer at the edge which results in the gate oxide.

This gate oxide smiling at the gate edges is primarily responsible for the enhancement of the saturation threshold voltage (Vts) for short channel length transistors and, through the reduction of the gate to source overlapping capacitance and parasitic resistance, the enhancement of the speed. Deeper source and drain junctions or lower channel doping, or shorter channel length can result in higher drive current, but lower saturation threshold voltage (Vts). Thus, for the same saturation threshold voltage (Vts), by having deeper source and drain junctions or lower channel doping, or shorter channel length, the field-effect transistors in the present invention can have higher drive current than the conventional field-effect transistors for a given Vts.

Figure 1A:
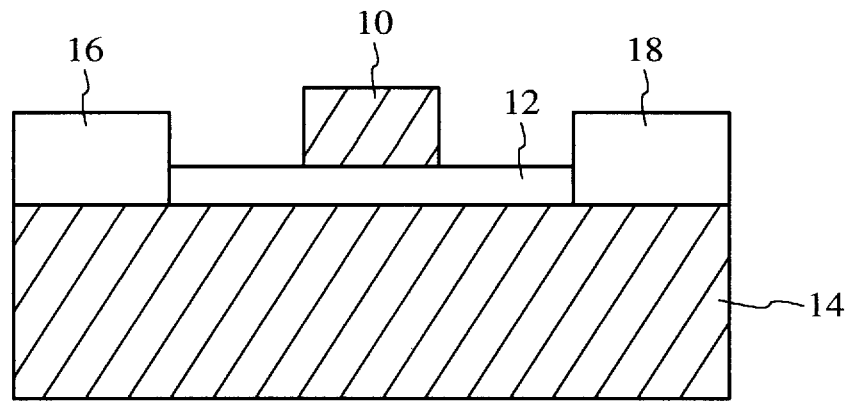
FIG. 1a shows the disposition of the gate.
Figure 1B:
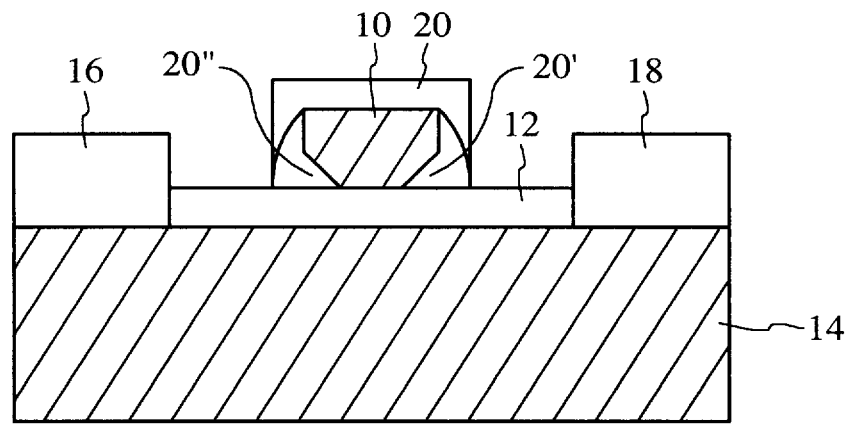
FIG. 1b shows the result of the innovative gate oxidation.
Figure 1C:
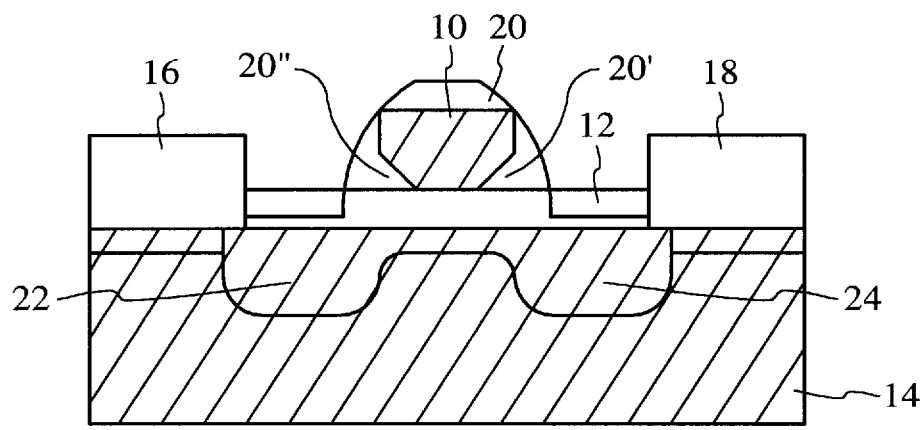
FIG. 1c shows the dispositions of the source and the drain.

FIGS. 1a, 1b and 1c show a simplified example of the field-effect transistor fabrication flow involving the innovative gate oxidation process.

FIG. 1a shows the disposition of the gate, which comprises the gate conductive layer 10 and the gate dielectric layer 12, on a substrate 14, which is partially covered by insulating layers 16 and 18.

FIG. 1b shows the result of the innovative gate oxidation process. During the innovative gate oxidation process, oxygen penetrates into the interfaces of the gate conductive layer 10/gate dielectric layer 12 and the gate dielectric layer 12/silicon substrate 14 and oxidizes portions of the gate conductive layer 10 and silicon substrate 14 at the edges due to the gate oxide smiling, which results in an increased effective thickness of the gate dielectric layer 12. More specifically, during the innovative gate oxidation process, an oxide layer 20 is formed around the gate conductive layer 10 and extends into the edges of the gate conductive layer 10 and the silicon substrate 14 at locations of 20' and 20", which results in an increase of the effective thickness of the gate dielectric layer 12.

Figure 5:
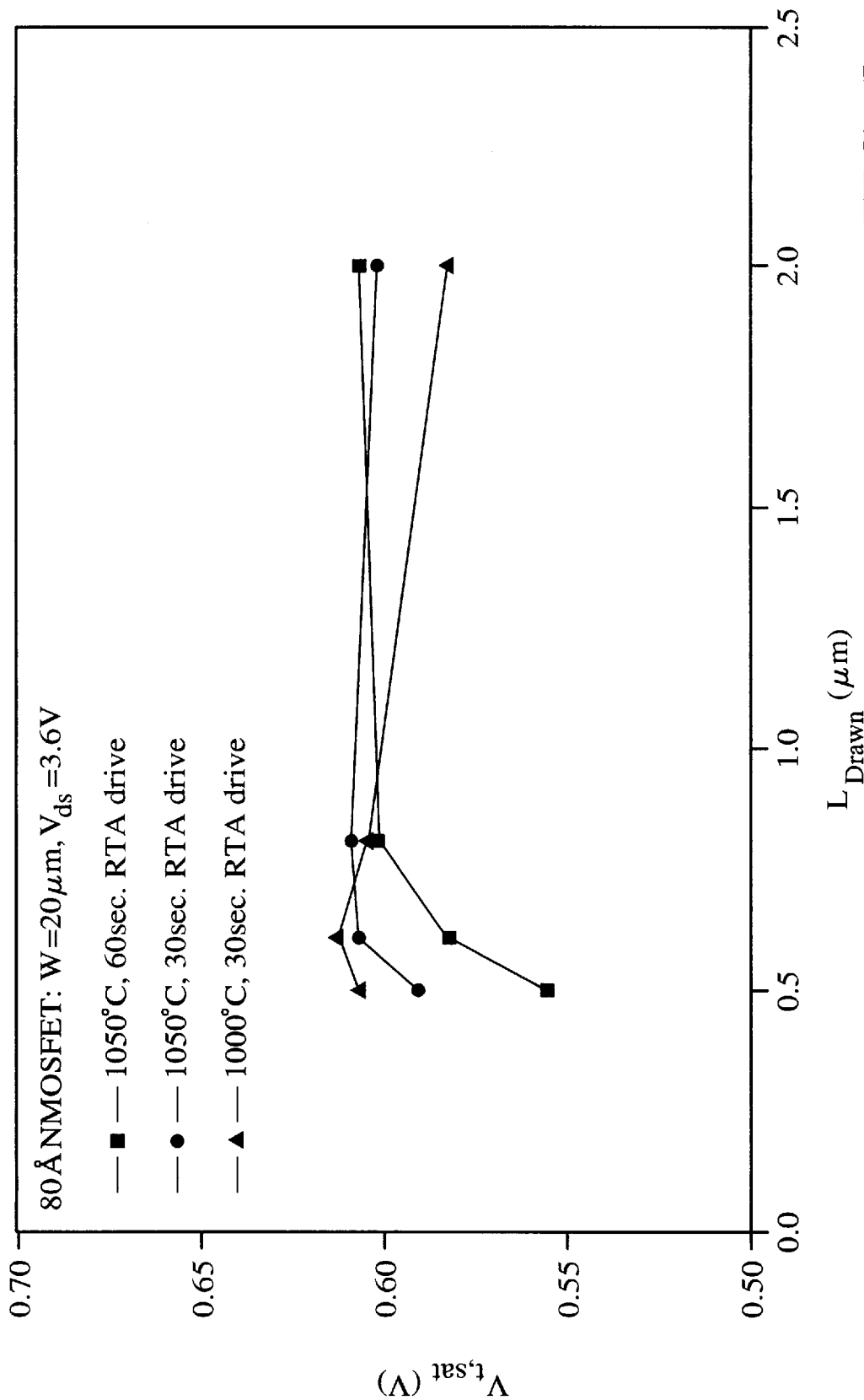
FIG. 5 shows Vt roll-off characteristics for various POX optimization due to rapid thermal anneal (RTA).

FIG. 1c shows the dispositions of the source 22 and the drain 24 after oxygen smiling. The optimization POX process requires the junction edge be inside the smiling during the final junction drive. The advantage of enhanced Vts for short channel device and speed enhancement diminishes when the junctions are driven out by rapid thermal anneal (RTA) of the smiling regions as shown in FIG. 5. This is typically a trade-off between Idsat and speed. The final junction edge and the shape of the smiling provides the best of both of these features.

A particular embodiment of the present invention is the fabrication of MOS transistors with polysilicon as the gate conductive layer 10 and silicon oxide 12 as the gate dielectric layer, and with the source and drain fabricated by the low doped drain (LDD) implant. In this particular case, the innovative gate oxidation process is a polysilicon oxidation (POX) process. The oxidation temperature and oxidation time duration for optimized transistor performances have been found to be 850° C. and 115 minutes, respectively.

Figure 2:
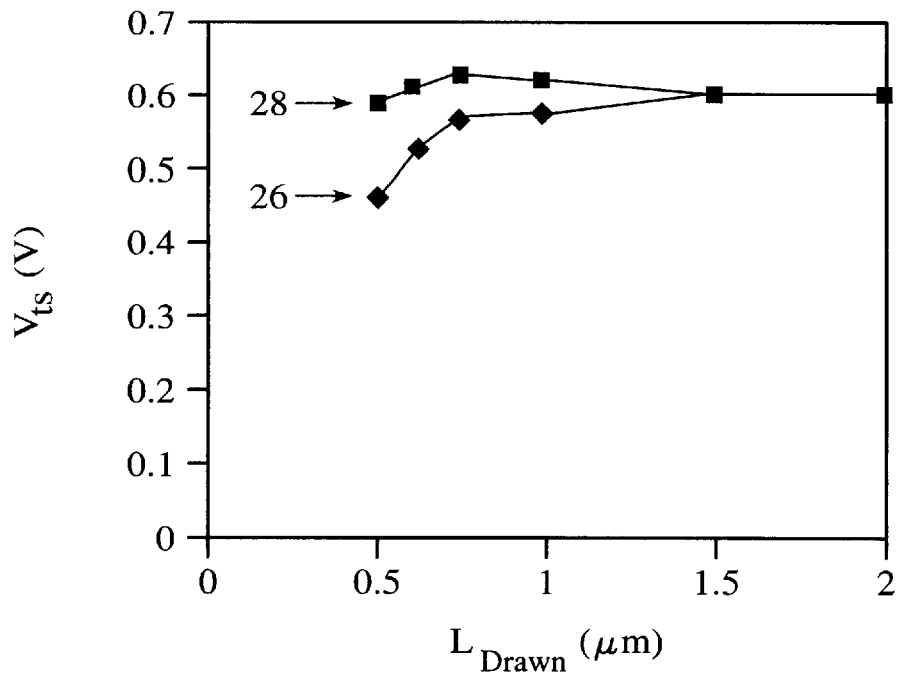
FIG. 2 shows the measured saturation threshold voltage (Vts) of NMOS transistors with and without POX as a function of the transistor channel length characterized by the drawn gate length (Ldrawn).
Figure 3:
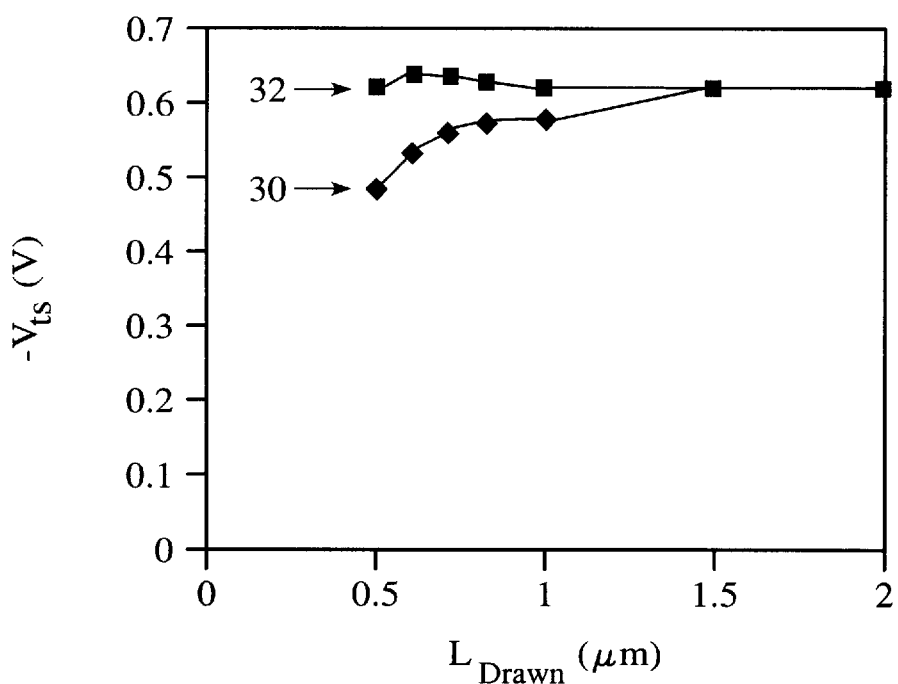
FIG. 3 shows the measured saturation threshold voltage (Vts) of PMOS transistors with and without POX as a function of the transistor channel length characterized by the drawn gate length (Ldrawn).

Without POX, as shown in FIGS. 2 and 3, the saturation threshold voltages (Vts) of both NMOS transistors (curve 26) and PMOS transistors (curve 30) start to rapidly roll off when the transistor channel length characterized by the drawn gate length (Ldrawn) is 0.7 mm or below. With the optimized POX, the saturation threshold voltage (Vts) of NMOS transistors (curve 28), as shown in FIG. 2, just starts to roll off when the transistor channel length characterized by the drawn gate length (Ldrawn) is 0.5 mm and that for PMOS transistors (curve 32), as shown in FIG. 3, does not roll off even when the transistor channel length characterized by the drawn gate length (Ldrawn) is 0.5 mm.

Figure 3A:
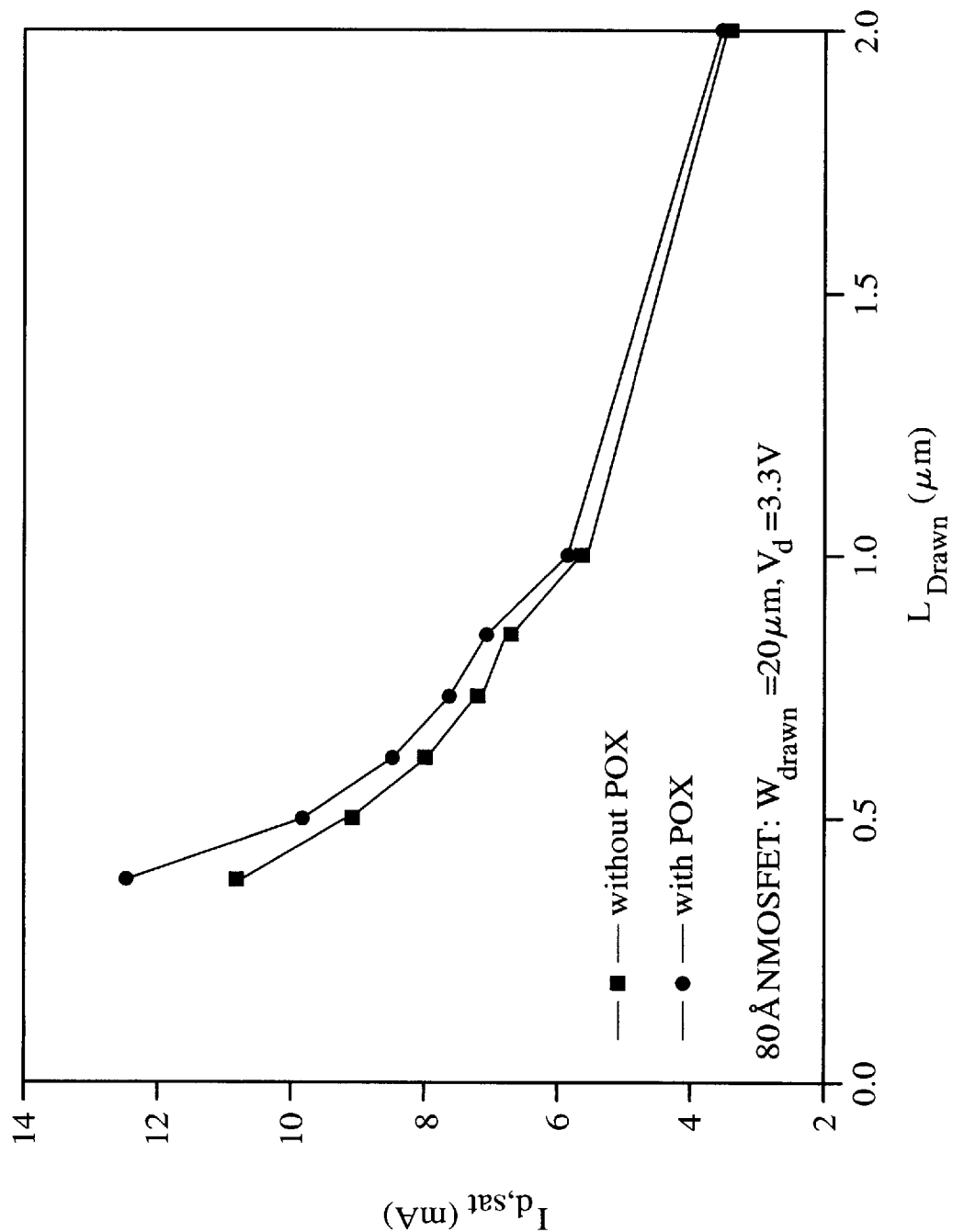
FIG. 3a shows the measured drive current of NMOS transistors with and without POX as a function of the transistor channel length characterized by the drawn gate length (Ldrawn).

By using optimized POX, the effective channel length of MOS transistors with Vts values allowing the controllability of the transistors can be easily extended to 0.2 mm shorter than a device with the conventional process if the Vts requirements for both transistor are the same. Therefore, a transistor manufactured in accordance with the optimized POX process will have a higher drive current for a fixed Vts as shown in FIG. 3a.

The enhancement of the saturation drive current by POX has been found by measuring saturation drive current (Idsat) of NMOS transistors with and without POX as a function of the drawn gate length (Ldrawn). The NMOS transistor with POX has about 10% higher saturation drive current (Idsat) than that without POX when the Vts for both devices is 0.6v.

Figure 4:
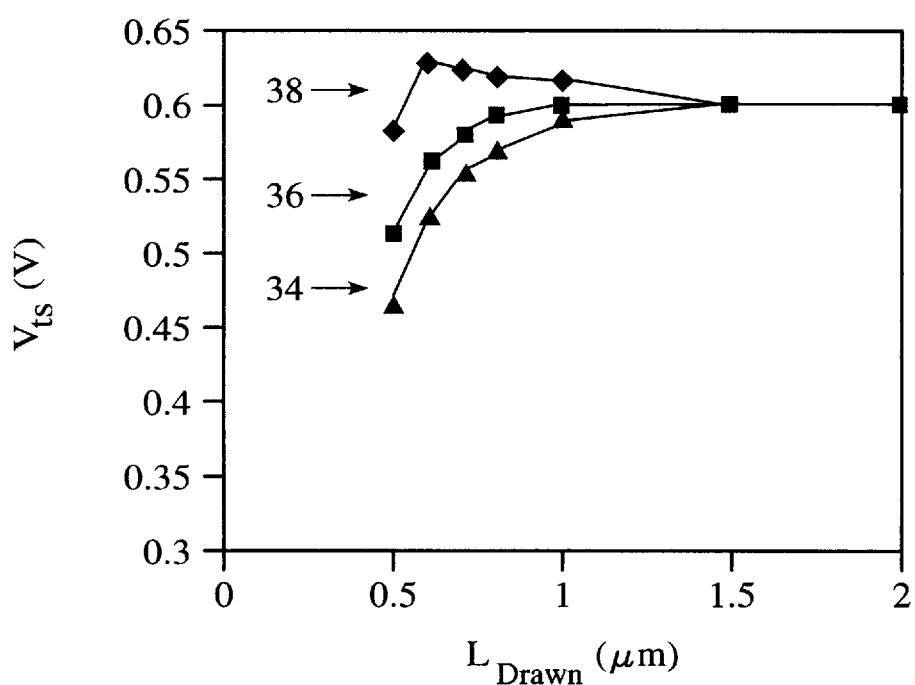
FIG. 4 shows the measured saturation threshold voltage (Vts) of NMOS transistors without POX and with POX under various conditions as a function of the transistor channel length characterized by the drawn gate length (Ldrawn).

FIG. 4 shows the measured saturation threshold voltages (Vts) of NMOS transistors without POX (curve 34) and with POX under various conditions, such at 850° C. for 115 minutes (curve 36) and 900° C. for 8 minutes (curve 38), as a function of the transistor channel length characterized by the drawn gate length (Ldrawn). It is clear that the NMOS transistor with POX at 850° C. for 115 minutes has the highest saturation threshold voltage (Vts).

The enhancement of the speed by Pox has been demonstrated by measuring the time per stage (tps) of two individual lots (Lot 1 and Lot 2) on 101 stage CMOS ring oscillators with and without POX and with POX before and after LDD implant. The two ring oscillators have similar drawn gate lengths, effective channel lengths (Leff,n and Leff,p) and Vts values.

For Lot 1, the device with POX (Leff,n=0.366 mm and Leff,p=0.368 mm) has a shorter time per stage (tps=109 ps) and the device without POX (Leff,n=0.363 mm and Leff,p=0.347 mm) has a longer time per stage (tps=111 ps), even though the former has longer effective channel lengths than the latter and higher Vts. It is important to note that the longer effective channel lengths themselves are not in favor of shorter time per stage (tps).

For Lot 2, the device with POX before LDD implant has a shorter time per stage (tps=99 ps) and the device with POX after LDD implant has a longer time per stage (tps=107 ps), which indicates that the junction should be inside of the smiling to gain speed improvement. This confirmed that the thermal after POX should ensure the junction is inside of the smiling. If the product is Idsat limited the lowering channel doping or shorting channel length or increasing junction depth are suggested to maximize Idsat at a given acceptable Vts. If the product is speed limited, then the smiling and the relative junction location inside the smiling are adjusted to gain better Vts control and higher speed performance.

Optionally, HCl can be introduced during the innovative gate oxidation process. By varying the HCl flowrate the shape of the smiling changes at a given rate, this can help to optimize the innovative gate oxidation process without varying the oxidation temperature and oxidation time duration, to be optimized independently without unnecessarily altering other transistor parameters, such as channel doping profile.

The present invention reduces the sensitivity of the transistor quality to the transistor fabrication process as the present invention allows more tolerance in the transistor channel length and junction depth than conventional transistor fabrication processes. This directly benefits process control and product yield. Requiring no additional hardware as compared to the conventional transistor fabrication process, the present invention is also suitable for volume production.

Thus, the present invention has been described herein with reference to a particular embodiment for a particular application. Those having ordinary skill in the art and access to the present teachings will recognize additional modifications, applications and embodiments within the scope thereof. The present invention can also be implemented with metal-insulator-semiconductor (MIS) field-effect transistors in general, as well as silicon-on-insulator (SOI) transistors.

It is therefore intended by the appended claims to cover any and all such applications, modifications and embodiments within the scope of the present invention.

We claim:

1. A field-effect transistor fabrication process comprising the steps of:

disposing at least one gate on a substrate;

exposing said gate to oxygen and HCl for approximately 115 minutes at approximately 850° C.

disposing at least one source on said substrate; and disposing at least one drain on said substrate.

2. The field-effect transistor fabrication process of claim 1 wherein the step of disposing said gate further including the step of disposing a conductive layer and a dielectric layer, said dielectric layer insulating said conductive layer from said substrate, said source and said drain.

3. The field-effect transistor fabrication process of claim 2 wherein the step of disposing said conductive layer comprises disposing a polysilicon layer.

4. The field-effect transistor fabrication process of claim 2 wherein the step of disposing said dielectric layer comprises disposing a silicon oxide layer.

5. The field-effect transistor fabrication process of claim 2 wherein the step of disposing said conductive layer comprises disposing a polysilicon layer, and the step of disposing said dielectric layer comprises disposing a silicon oxide layer.

6. A field-effect transistor fabrication process comprising the steps of:

disposing at least one gate on a substrate, disposing at least one source on said substrate, disposing at least one drain on said substrate, the step of disposing of said gate further including the step of disposing a conductive layer and a dielectric layer insulating said conductive layer from said substrate, said source and said drain, exposing said gate to oxygen and HCl prior to the steps of disposing of said source and said drain, and varying a flow rate of the HCl to change a shape of a smiling.

7. A field-effect transistor fabrication process comprising the steps of:

disposing at least one gate on a substrate, disposing at least one source on said substrate, disposing at least one drain on said substrate, the step of disposing said gate further including the step of disposing a conductive layer and a dielectric layer insulating said conductive layer from said substrate, said source and said drain, and exposing said gate to oxygen and HCl at approximately 850° C. prior to the steps of disposing said source and said drain.

8. The field-effect transistor fabrication process of claim 7 wherein the step of disposing said conductive layer comprises disposing a polysilicon layer.

9. The field-effect transistor fabrication process of claim 7 wherein the step of disposing said dielectric layer comprises disposing a silicon oxide layer.

10. The field-effect transistor fabrication process of claim 7 wherein the step of disposing said conductive layer comprises disposing a polysilicon layer, and the step of disposing said dielectric layer comprises disposing a silicon oxide layer.

11. The fabrication process of claim 7, wherein the gate is exposed to oxygen and HCl for approximately 115 minutes.

* * * * *